United States Patent [19]

Westendorp et al.

[11] Patent Number: 5,789,867
[45] Date of Patent: Aug. 4, 1998

[54] APPARATUS AND METHOD FOR IGNITING PLASMA IN A PROCESS MODULE

[75] Inventors: Han Westendorp, Rockport; Hans Meiling, Beverly; John William Vanderpot, Boxford; Donald Berrian, Topsfield, all of Mass.

[73] Assignee: TEL America, Inc., Mountain View, Calif.

[21] Appl. No.: 595,753

[22] Filed: Feb. 2, 1996

Related U.S. Application Data

[62] Division of Ser. No. 183,529, Jan. 19, 1994, Pat. No. 5,565,036.

[51] Int. Cl.$^6$ .................................................. H01J 7/24
[52] U.S. Cl. .......................... 315/111.21; 118/723 R; 315/326
[58] Field of Search .......................... 315/111.21, 344, 315/326; 118/723 R

[56] References Cited

U.S. PATENT DOCUMENTS

| | | | |
|---|---|---|---|
| 4,557,819 | 12/1985 | Meacham | 204/298 |
| 4,563,367 | 1/1986 | Sherman | |
| 4,617,079 | 10/1986 | Tracy et al. | 156/345 |
| 4,664,938 | 5/1987 | Walker | 427/39 |
| 4,933,203 | 6/1990 | Curtins | 427/38 |
| 4,990,365 | 2/1991 | Treichel et al. | 427/45.1 |
| 5,085,727 | 2/1992 | Steger | 156/345 |
| 5,102,496 | 4/1992 | Savas | 156/643 |
| 5,108,860 | 4/1992 | Birkle et al. | 430/57 |
| 5,110,437 | 5/1992 | Yamada et al. | 204/298.33 |
| 5,252,178 | 10/1993 | Moslehi | 156/643 |
| 5,308,950 | 5/1994 | Ramm | 219/121.43 |
| 5,368,676 | 11/1994 | Nagasaki | 156/345 |
| 5,387,842 | 2/1995 | Roth et al. | 315/111.21 |

FOREIGN PATENT DOCUMENTS

| | | |
|---|---|---|
| 216603 (A3) | 4/1987 | European Pat. Off. |
| 0 364 215 A2 | 4/1990 | European Pat. Off. |
| 0 470 580 A2 | 2/1992 | European Pat. Off. |
| 0 489 407 A2 | 6/1992 | European Pat. Off. |
| 510401 (A1) | 10/1992 | European Pat. Off. |

OTHER PUBLICATIONS

A. Shah et al., "A Si–H Films Deposited at High Rates in a VHF Silane Plasma: Potential for Low Cost Solar Cells", p. 282, Sep. 1988, 20th IEEE Photovoltaic Specialists Conference, 26–30 May 1988, held at Las Vegas, NV.

H. Curtins et al., "Influence of Plasma Excitation Frequency for a Si–H Thin Film Deposition", J. Plasma Chem. and Plasma Processing, vol. 7, No. 3, pp. 267–273, 1987.

(List continued on next page.)

*Primary Examiner*—Robert Pascal
*Assistant Examiner*—Michael Shingleton
*Attorney, Agent, or Firm*—Lahive & Cockfield, LLP

[57] ABSTRACT

The invention provides apparatus and methods for improving systems that expose samples to reactive plasmas, and more particularly for igniting plasma within a process module. The systems are of the type which have an electrode pair and a radiofrequency generator connected to one electrode. Gas is injected between the electrodes where it is ionized and transformed into a plasma. The invention includes (i) ignition means for ionizing gas, e.g., silane, between electrodes which are separated by a small gap of less than approximately one centimeter; and (ii) a radiofrequency energy generator that preferably operates at high frequencies, e.g., 60 MHz, to transform molecules into plasma. Several embodiments of ignition means are taught by the invention, including: an electron source, an ultraviolet source, a second radiofrequency energy generator, and radioactive sources, among others. A process module constructed according to the invention, using high frequency energy and small electrode separations, has a high rate of deposition and a high production yield.

12 Claims, 5 Drawing Sheets

OTHER PUBLICATIONS

European Search Report mailed Jun. 6, 1995.

H. Curtins, "High Rate Deposition of Amorphous Hydrogenated Silicon: Effect of Plasma Excitation Frequency", IEE, vol. 23, No. 5, 26th Feb. 1987.

H. Curtins et al., "Influence of Plasma Excitation Frequency on Deposition Rate and on film Properties for Hydrogenated Amorphous Silicon," Mat. Res. Soc. Symp. Proc., vol. 95, pp. 249–253, Apr. 1987.

A. Shah et al., "High Rate Deposition of Amorphous Silicon by VHF Glow Discharge for Solar Cell Applications", vol. 1 p. 876, May 1988, 8th E.C. Photovotaic Solar Energy Conference, held at Florence, IT, 9–13 May 1988.

H. Curtins et al., "High Rate Deposition of Hydrogenated Amorphous Silicon by the VHF GD Method.", pp. 695–698, May 1987, 19th IEEE Photovoltaic Specialists Conference, 4–8 May 1987, held at New Orleans, LA.

C.W. Pearce et al., "Characteristics of silicon nitride deposited by plasma–enhanced chemical vapor deposition using a dual frequency radio–frequency source", J. Appl. Phys., vol. 71, No. 4, pp. 1838–1841, Feb. 1992.

E.P. van de Ven et al., "Advantages of Dual Frequency PECVD for Deposition of ILD and Passivation Films", 1990, Presented at V.I.C. conference 1990.

E.P. van de Ven, "Advances in Plasma Enhanced Thin Film Deposition", SPIE, vol. 1037, pp. 117–124, Nov. 1988.

APPARATUS AND METHOD FOR IGNITING PLASMA IN A PROCESS MODULE

This application is a divisional application of Ser. No. 08/183,529 filed on Jan. 19, 1994 now U.S. Pat. No. 5,565,036. The contents of all of the aforementioned application(s) are hereby incorporated by reference.

BACKGROUND

This invention relates to apparatus and methods for exposing samples to reactive plasmas. More particularly, the invention relates to apparatus and methods for igniting plasma within a process module that is, for example, suitable for use in Chemical Vapor Deposition (CVD) and in Plasma Enhanced Chemical Vapor Deposition (PECVD) processes.

As used herein, a "sample" generically describes a substrate, such as a glass panel or a silicon wafer, which is suitable for deposition techniques, for example by PECVD. The sample typically has one surface that is treated to receive one or more film depositions.

Vacuum deposition systems which deposit semiconducting or insulating films onto samples are well-known and are utilized in a wide range of scientific fields. Complex PECVD systems have been developed, for example, to manufacture devices such as thin film transistors (TFTs), liquid crystal displays (LCDs), flat panel displays (FPDs), solar cells, photodetectors, and integrated circuit structures.

Typically, these systems include one or more evacuated process modules that are used to expose the sample to reactive plasmas. Such a process module typically includes first and second electrodes within a chamber and spaced apart to form a gap therebetween: one electrode is electrically grounded to the chamber, and the other electrode is connected to a radiofrequency (RF) source which generates a radiofrequency discharge within the gap. The module also has gas inlets and gas outlets which direct selected gases, such as silane, into and through the gap.

To deposit a selected film on a sample, the sample is suspended in the gap spaced away from the active RF electrode, e.g., mounted to the grounded electrode, and a selected gas introduced into the inter-electrode gap. When the gas is exposed to the RF field, it ionizes and forms a reactive plasma which deposits a film onto surfaces exposed to the plasma, including the sample surface. The rate at which this film is deposited onto the sample surface is dependent upon several factors, including: the magnitude of the vacuum in the process module; the electrode spacing; the power and the frequency of the RF energy; and the gas flow rate.

For practical reasons, many prior vacuum deposition systems utilize excitation frequencies of approximately 13.56 MHz. However, it is known to be beneficial to deposit films at higher frequencies, since faster deposition rates are realized. U.S. Pat. No. 4,933,203, for example, discloses the deposition of hydrogenated amorphous silicon at frequencies from 30 MHz to 150 MHz, realizing a 500% to 1000% increase in deposition rates over those attained with 13.56 MHz systems. Such increases correlate to improved manufacturing throughput and efficiencies.

Nevertheless, further increases in deposition rates are sought to attain further improvements in manufacturing throughput and efficiency. One known technique for increasing deposition rates is to decrease the spacing between the two chamber electrodes. However, the reduction of the spacing is not without limit. U.S. Pat. No. 4,933,203 discloses, for example, that the spacing has a practical lower limit of ten millimeters because of certain phenomena. These phenomena include difficulties associated with igniting plasma at small electrode spacings.

Accordingly, it is one object of this invention to provide apparatus and methods for depositing films onto samples from a vapor.

It is another object of the invention to provide improved CVD and PECVD apparatus and methods for igniting a plasma within process modules that have small electrode spacings.

More particularly, an object of the invention is to provide PECVD apparatus and methods which increase the deposition rate of films deposited on samples exposed to reactive plasmas.

Another object of the invention is to provide vacuum deposition systems that expose samples to reactive plasmas, and which attain relatively high production yield.

Further object of the invention is to provide such apparatus and methods for exposing samples to reactive plasma and which are relatively low in cost and reliable in operation.

Yet another object of the invention is to provide apparatus and methods of the above character and which also can etch sample surfaces.

These and other objects of the invention will be apparent in the description which follows.

SUMMARY OF THE INVENTION

The invention attains the aforementioned objectives by providing, in one aspect, improvements to plasma process modules which expose samples to reactive plasma. These modules include first and second radiofrequency electrodes and a radiofrequency generator connected to the second electrode. In accordance with the invention, the first and second electrodes are spaced apart to form a substantially uniform gap therebetween of less than approximately one centimeter.

The improvement also features an ionizing element for ionizing gas injected between the electrodes. The ionizing element ignites the plasma within the electrode gap and the radiofrequency energy generator afterwards transforms molecules within the module into plasma by generating RF energy at a primary frequency that is preferably sixty megahertz.

The improvement preferably comprises a gas that is injected between the electrodes. The gas is of a type that is suitable for ionization and that is suitable for transformation into a plasma when exposed to radiofrequency energy at the primary frequency. In accord with the invention, the gas is generally selected from gases such as silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), chlorine ($Cl_2$), sulfur hexafluoride ($SF_6$), hydrogen chloride (HCl), carbon tetrachloride ($CCl_4$), hydrogen bromide (HBr), carbon dichloride difluoride ($CCl_2F_2$), boron trichloride ($BCl_3$), silicon tetrachloride ($SiCl_4$), boron tribromide ($BBr_3$), chlorotrifluoride ($ClF_3$), fluorine ($F_2$), and mixtures thereof.

To inject a gas between the electrodes, the improvements thus include, in other aspects, gas inlets and gas outlets, and associated pump mechanisms. The pump mechanisms pump gas through the gas inlet and into the gap, and extract gas and other molecules through the gas outlet as process waste.

In another aspect, the invention provides an electron source with a filament as the ionizing element. The electron source is arranged to inject electrons between the electrodes at an energy that is preferably at least 300 eV to ionize gas in the gap. In certain aspects, the electron source is spaced selectively at a distance from the gap to select the electron energy entering the gap. Alternatively, the source includes an extraction slit that has a selectively variable positive potential relative to the filament, for extracting electrons from the filament with energies of variable magnitude and greater than 300 eV.

In still another aspect, the improvement provides an ultraviolet light source as the ionizing element and which irradiates ultraviolet radiation between the electrodes to ionize gas in the gap. The ultraviolet light source preferably generates photons with energies that are greater than approximately five electron volts. In certain preferred aspects, the improvement includes an UV interface that is transmissive to the ultraviolet radiation generated by the UV source, so that the UV source generates photons which irradiate the gap through the UV interface. Such an ultraviolet light source is preferably located in standard atmosphere outside the module, which is evacuated, and is arranged to illuminate the vacuum of the evacuated module through the UV interface.

In certain aspects, the ultraviolet light source includes (i) a reflector and an aperture which, in combination, collect the emitted ultraviolet radiation and transmit the radiation in a concentrated direction toward the gap in the module; and (ii) one or more optical elements which collect and collimate the transmitted concentrated radiation from the reflector to the within the gap.

In still other aspects according to the invention, the improvement provides a sparking apparatus as the ionizing element. The sparking apparatus generates a spark or other electric discharge between the electrodes to ionize gas in the gap. Preferably, therefore, the sparking apparatus is isolated from the ground of the process chamber and has an exposed spark gap arranged with a line of sight from the spark gap to between the electrodes, such that an emitted spark at the spark gap injects electrons to within the gap.

In yet another aspect of the invention, the improvement provides a second radiofrequency generator that is connected to the second electrode. The second radiofrequency generator has a second frequency, preferably 400 kHz, that is less than the primary frequency and that generates radiofrequency discharges between the electrodes at the second frequency to ionize gas in the gap. In certain preferred aspects, the second radiofrequency generator pulses the second frequency at a selected rate. It is also preferred, according to the invention, to inhibit the second radiofrequency generator once gas is ionized within the gap. The two radiofrequency generators typically operate in combination to generate a voltage between approximately 1 kV and 5 kV across the two electrodes.

A process module according to other aspects of the invention includes a high direct current power source that is connected to the second electrode. Such a direct current power source generates a physical spark between the electrodes and accordingly ionizes gas in the gap.

In another aspect, a process module of the invention includes evacuation apparatus, e.g., a pump and/or compressor, that evacuates the module selectively to approximately 0.01 Torr. Preferably, such a process module also includes pressurizing apparatus, e.g., a pump and/or compressor, which pressurizes the module selectively. In accordance with the invention, the improvement provides for alternately controlling the pressure within the module to selectively pressurize the module for a short duration within which ionization of gas occurs. For example, the module is first evacuated by a pump to approximately 0.01 Torr so that oxidation and sample impurity is kept to a minimum. Thereafter, a deposition or etch gas is injected between the electrodes and the pump pressurizes the module to approximately 0.5 Torr so that the gas is ignited by the primary frequency generator. Once gas is ionized, the module is depressurized to approximately 0.1 Torr which is a preferred deposition or etch operational pressure.

In still another aspect, the process module of the invention includes an x-ray source, or alternatively a radioactive source, as the ionization element. The x-ray or radioactive source is arranged to generate a beam of x-ray or radioactive radiation into the gap to ionize gas therein. Preferably, to enhance user safety, such a source is shielded to confine the x-ray or radioactive radiation substantially to one or more paths extending from the source and through the gap.

The improvements of the invention also include a plurality of gases which operate in combination with one another as the ionization element. For example, a first primary gas can include silane ($SiH_4$), disilane ($Si_2H_6$), hydrogen ($H_2$), ammonia ($NH_3$), phosphine ($PH_3$), nitrogen trifluoride ($NF_3$), helium (He), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), chlorine ($Cl_2$), sulfur hexafluoride ($SF_6$), hydrogen chloride (HCl), carbon tetrachloride ($CCl_4$), hydrogen bromide (HBr), carbon dichloride difluoride ($CCl_2F_2$), boron trichloride ($BCl_3$), silicon tetrachloride ($SiCl_4$), boron tribromide ($BBr_3$), chlorotrifluoride ($ClF_3$), fluorine ($F_2$), and mixtures thereof. A second gas, such as helium (He), argon (Ar), krypton (Kr), nitrogen ($N_2$), xenon (Xe) neon (Ne), and mixtures thereof, is combined with the first gas to form a gaseous mixture that is transformable into plasma by the primary frequency. Preferably, therefore, the mixture of the two gases is ignitable by a radiofrequency source that generates 60 MHz discharges. Once the mixture of the two gases is ignited, the second gas is inhibited from flowing into the module, so that deposition onto a sample surface results without influence from the second gas.

In still another aspect, the improvement of the invention includes a motion actuator, e.g., a linear actuator, as the ionization element and which moves at least one of the electrodes selectively to change the dimension of the gap between the electrodes. The motion actuator separates the electrodes to a first dimension, at which the radiofrequency generator, of high primary frequency, ionizes gas injected between the electrodes. Preferably, the motion actuator thereafter reduces the gap spacing to below approximately one centimeter, a desired dimension for high rate plasma deposition.

In yet another aspect, the improvement includes an atomic element as the ionization element and which has an ionization energy of no more than twenty-five electron volts. The atomic element, such as helium or argon, is injected into the gap to ionize gas therein.

The invention also provides a sample-processing method for exposing a sample to reactive plasma within a process module having first and second electrodes. In particular, the improvement includes the steps of (i) arranging the first and second electrodes within the module to form a substantially uniform gap separating the electrodes of between approximately one and ten millimeters; (ii) injecting a gas, such as silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), carbon tetrachloride ($CCl_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, into the gap; (iii) ionizing the gas; and (iv) applying radiofrequency energy to the gap which has a primary frequency, e.g., 60 MHz, that transforms molecules into plasma.

In one aspect, the method includes the step of injecting a second gas into the gap wherein the first and second gases form a gaseous mixture that is transformable into plasma by the primary frequency. Preferably, the second gas is helium (He), argon (Ar), krypton (Kr), nitrogen ($N_2$), xenon (Xe) neon (Ne), or mixtures thereof.

In still another aspect, the method according the invention includes the additional steps of (i) injecting into the module an etch gas, such as chlorine ($Cl_2$), sulfur hexafluoride ($SF_6$), hydrogen chloride (HCl), carbon tetrachloride ($CCl_4$), hydrogen bromide (HBr), carbon tetrafluoride ($CF_4$), hexafluoroethane ($C_2F_6$), nitrogen trifluoride ($NF_3$), carbon dichloride difluoride ($CCl_2F_2$), boron trichloride ($BCl_3$), silicon tetrachloride ($SiCl_4$), oxygen ($O_2$), boron tribromide ($BBr_3$), chlorotrifluoride ($ClF_3$), fluorine ($F_2$), or mixtures thereof; (ii) ionizing the etch gas; and (iii) applying to the gap radiofrequency energy with a primary frequency, e.g., 60 MHz, to transform the etch gas into an etch plasma such that surfaces in contact with the etch plasma are etched. This method preferably includes the step of arranging the electrodes to form a substantially uniform gap separating the electrodes of between approximately one and seventy five millimeters during the etching of the surfaces.

Other particularities associated with the deposition of certain semiconductor coatings, e.g., amorphous silicon, are described in U.S. Pat. No. 4,933,203, which is herein incorporated by reference

DESCRIPTION OF ILLUSTRATED EMBODIMENTS

Figure 1:
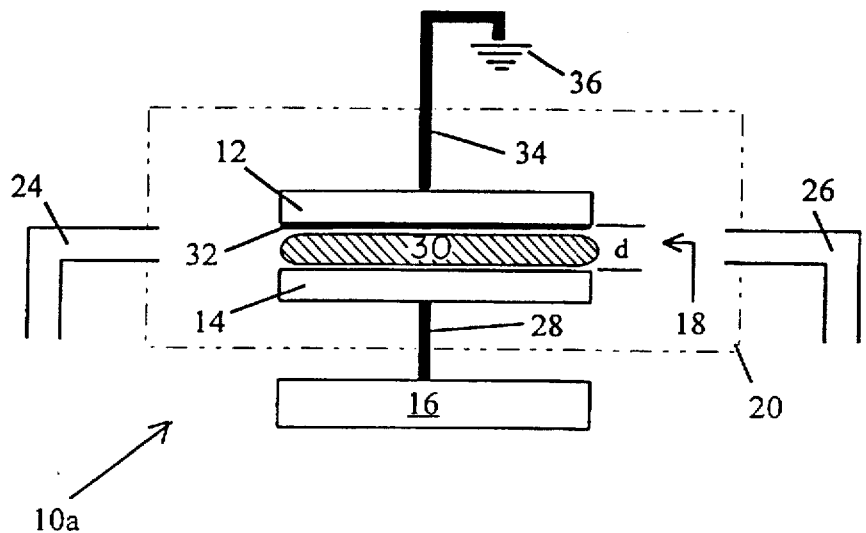
FIG. 1 is a schematic side view of a process module constructed in accordance with the invention.

FIG. 1 schematically illustrates a process module $10a$ constructed in accordance with the invention. The module $10a$ includes a first radiofrequency (RF) electrode 12, a second RF electrode 14, and a RF generator 16 interconnected with the second electrode 14. The electrodes are spaced apart at a distance "d" to form a substantially uniform gap 18 between the electrodes 12 and 14. The distance "d" is less than approximately ten millimeters and preferably more than one millimeter. A pressure-tight housing 20 surrounds the electrodes 12 and 14 so that the module $10a$ may be evacuated selectively, to between approximately 0.01 and ten Torr, by methods known to those skilled in the art.

The module $10a$ includes gas inlet 24 and gas outlet 26: the inlet 24 is used to inject gas into the module $10a$; and the outlet 26 is used to extract gas, particulates, and other molecules from the module $10a$. In operation, a gas that is suitable for ionization and for transformation into plasma, e.g., silane, is introduced through the inlet 24 and into the gap 18. The gas is ionized, in accordance with further features of the invention described below, and transformed into plasma by RF energy, which preferably has a primary frequency of 60 MHz. The RF energy is generated by the generator 16 and transferred to the gap 18 via the RF connection 28 and electrodes 12 and 14, thereby transforming molecules of the injected gas into a plasma 30.

A film is deposited onto surfaces in contact with the plasma 30. Accordingly, a sample 32, e.g., a flat glass or silicon wafer with opposed surfaces, is introduced into the gap 18 in the module $10a$ to expose the sample 32 to the plasma 30 for deposition of one or more films onto its surface. The sample 32 is typically mounted to the first electrode 12 such that the sample 32 is spaced away from the active RF second electrode 14. The first electrode 12, therefore, is preferably electrically grounded by the grounding connection 34 and ground 36.

FIGS. 2, 4, 5, 5A, 6, 7, and 8 illustrate similar pressure modules 10 constructed according to the invention, and which show other preferred features of the invention. These figures show the sensing modules 10 in schematic cross-sectional views; yet it is to be understood that such views are to be interpreted in the context of a three-dimensional structure. For example, the modules 10 of FIGS. 1, 2, 4, 5, 5A, 6, 7 and 8 are generally rectangular in shape, each having another cross-sectional view that is similar in size, and perpendicular to, the associated illustrated view. Further understanding of a three-dimensional process module may be made with reference to FIG. 2, of U.S. application Ser. No. 08/084,415, entitled "Method and Apparatus for Inverting Samples in a Process", which is incorporated herein by reference.

Figure 2:
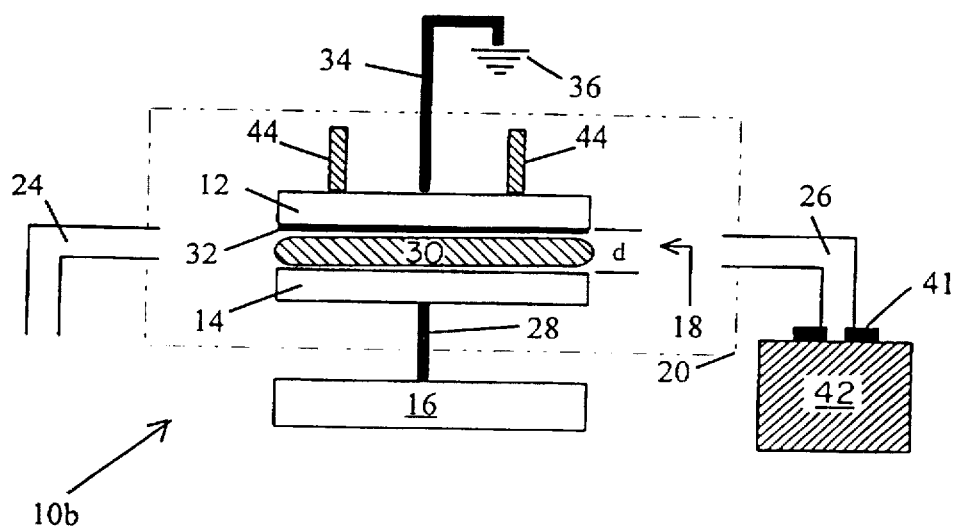
FIG. 2 is a side view of the process module of FIG. 1 with a pressure pump and linear actuators operable to enable ionization of gas within the module.

Among other factors, high deposition rates result from smaller electrode spacings; yet it is increasingly difficult to ignite plasma at increasingly smaller electrode spacings, particularly under ten millimeters. Therefore, the invention provides for the ionization of gas injected into the gap 18 of this small size, as described below. FIG. 2, for example, illustrates the module $10b$ connected to a pressure pump 42 at the gas outlet 26; and further including linear actuators 44 connected to the first electrode 12. Either of the structures 42 and 44 are independently operable in conjunction with other elements of the module $10b$ to ignite gas within the gap 18; or, alternatively, they cooperate together with the other elements of the module 10 to ignite the gas.

Figure 3:
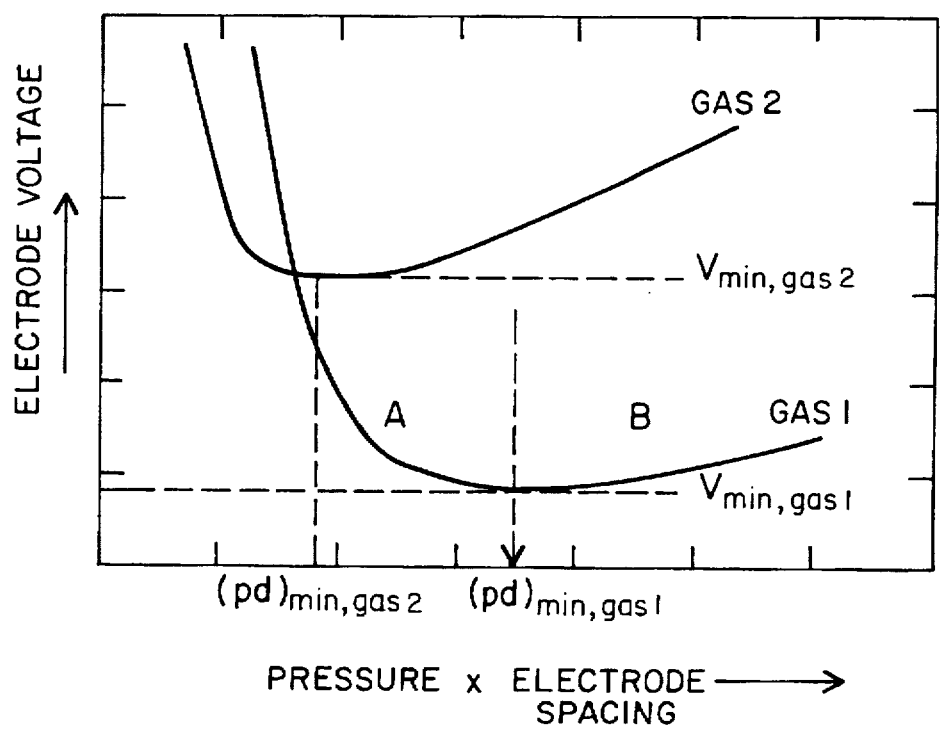
FIG. 3 graphically shows the relationship between ionization and electrode potential versus gap spacing and pressure for selected typical gases.

More particularly, the transformation of gas molecules such as silane, hydrogen, ammonia and nitrogen into a plasma—i.e., the ignition and the creation of a plasma—and, once ignited, the continual maintenance of the plasma within the module 10b are functionally dependent upon module pressure and electrode spacing. FIG. 3, for example, qualitatively illustrates plasma maintenance curves for two typical gases, Gas 1 and Gas 2, as the relation between the voltage differential required between the electrodes to maintain a discharge and the product of pressure and electrode spacing. The product of pressure and electrode spacing represents the horizontal axis. The voltage differential required between the electrodes to maintain a discharge within the gap 18 represents the vertical axis.

The shape of these two plasma maintenance curves, Gas 1 and Gas 2, can be understood with reference to the ionization physics within the module 10b. To ignite and maintain a plasma within the module 10b, electrons must be accelerated within the gap 18 to energies in which the collisions of the accelerated electrons with the gas molecules in the gap 18 cause ionization of the gas molecules, i.e., the creation of more electrons and ions. The probability for an electron to cause ionization is directly proportional to the pressure within the module 10b and the distance traveled by the electron in the plasma, as controlled by the electrode spacing. Relative to Gas 1, for example, if the magnitudes of the module pressure and/or electrode spacing are too small, there are not enough electrons created to ignite the plasma, as illustrated in region A, FIG. 3. If, on the other hand, the magnitudes of the module pressure and/or electrode spacing are too great, the electrons are not accelerated to energies sufficient to cause ionization because of inelastic collisions with gas molecules, as illustrated in region B, FIG. 3. Therefore, there is a condition 43 wherein the product of the module pressure and of the electrode spacing is such that the voltage required to ignite the plasma is at a minimum for the illustrated Gas 1.

According to the invention, the preferred operating conditions for depositing film from typical Gas 1 occur in region A, FIG. 3. By way of example, a plasma of hydrogen and silane is ignited in one instance at pressures above 0.6 Torr; however, below that pressure, no plasma is ignited. Nevertheless, after ignition at 0.6 Torr, the pressure is reduced to as low as 0.1 Torr, since the required voltage to maintain a discharge, and hence maintain the plasma, is lower than the voltage required to ignite, and thereby initiate, the plasma.

As also illustrated in FIG. 3, the minimum plasma maintenance voltage for Gas 1, i.e. Vmin, relative to the pressure-electrode product, i.e. (pd)min, is gas dependent. Thus, in accordance with the invention, the electrode spacing and/or module pressure are modified as a function of the particular gas within the module 18 to enable ignition, i.e., the transformation of those gas molecules into the plasma 30.

These gases are generally classified into two groups: deposition gases and etch gases. The preferred deposition gases used in accordance with the invention are silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof (the preferred deposition mixtures are silane and hydrogen; silane, ammonia and nitrogen; silane and phosphine; silane and methane; silane and borane; and silane and diborane). The preferred etch gases used in accordance with the invention are chlorine ($Cl_2$), sulfur hexafluoride ($SF_6$), hydrogen chloride (HCl), carbon tetrafluoride ($CF_4$), hydrogen bromide (HBr), carbon tetrachloride ($CCl_4$), nitrogen trifluoride ($NF_3$), carbon dichloride difluoride ($CCl_2F_2$), boron trichloride ($BCl_3$), silicon tetrachloride ($SiCl_4$), oxygen ($O_2$), boron tribromide ($BBr_3$), chlorotrifluoride ($ClF_3$), fluorine ($F_2$), and mixtures thereof (the preferred etch mixtures are carbon tetrafluoride and oxygen; hexafluoride and oxygen; and nitrogen trifluoride and oxygen).

With an electrode spacing of less than approximately ten millimeters, the RF generator 16 generally does not provide sufficient voltage to transform gas molecules injected into the gap 18 into plasma, such as illustrated in region A of FIG. 3. In operation, therefore, the pressure pump 42 of FIG. 2 initially operates as a vacuum pump to evacuate the module 10b to approximately 0.01 Torr, which reduces oxidation and other impurities that might form on the heated samples. Selected deposition gas molecules are then injected into the module 10b, and the pressure pump 42 controls the pressure within the module 10b by operation of the throttle 41 to between approximately 0.1 to 1 Torr, which represents a pressure range that permits ionization of the gas molecules by the primary RF generator 16. The throttle 41 functions as an orifice within the gas outlet 26 to increase or decrease the pressure in the module selectively: decreasing the orifice of the throttle 41 increases the pressure within the module 10b; while increasing the orifice decreases the module pressure. The pressure pump 42 increases the pressure within the module 10b selectively, such as in accordance with the plasma maintenance curve of FIG. 3, as a function of the gas within the module to enable the transformation of the gas molecules into plasma. Once the plasma is ignited, the pump 42 evacuates, or de-pressurizes, the module 10 to normal pressures, e.g., 0.1 Torr, which are preferred for uniform high rate deposition.

Thus, the pressure pump 42 of FIG. 2 is selectively operable to (i) pressurize the module 10b to enable the transformation of gas molecules injected into the gap 18 into plasma and (ii) de-pressurize, e.g., evacuate, the module 10b to enable high rate deposition at preferred conditions. Those skilled in the art can appreciate that the pump 42 is readily constructed as a vacuum pump or combination pump and compressor to provide the operations (i) and (ii). The operation between pressurization and de-pressurization within the module 10b is controllable, in accordance with the invention; and preferably short in duration, e.g., 1 second, so that gas is ionized and the module 10b returns to normal evacuated pressures without lengthy pressurization of the module 10b.

A similar ignition procedure is realized through operation of the linear actuators 44. The actuators 44 are connected to the first electrode 12 to move the electrode 12 and adjust the gap separation "d" selectively. Thus, to ignite the gas within the gap 18, the actuators 44 increase the separation between the electrodes 12 and 14 to a point, for example in accordance with FIG. 3, where the RF generator ignites and transforms the molecules into the plasma 30. Once ionization occurs, the RF generator 16 has sufficient voltage to maintain the plasma 30 within the gap 18; thus the actuators 44 reposition the electrode 12 to a gap separation "d" of less than approximately one centimeter to increase the deposition rate.

Linear actuators 44 preferably reside within the housing 22 so that the module 10b is evacuated without required mechanical motion through the sealed module housing wall 20. Therefore, the actuators 44 have electrical components (not shown), including wires and electrical feed-through fittings, which extend from the actuators 44 and through the housing 20 for communication to outside of the module 10. Alternatively, although not preferred, the actuators 44 physically extend through the evacuated module housing 20 through the use of mechanical seals (not shown).

In accordance with the invention, the pump 42 and the actuators 44 preferably operate simultaneously with the RF generator 16 to ionize gas. The required voltage to transform molecules into plasma decreases more rapidly by simultaneously increasing module pressure and electrode spacing. Therefore, the undesirable time duration away from ideal deposition conditions, e.g., 0.1 Torr and 1–9 mm gap separation, is decreased.

The invention thus provides the pump 42 and the actuators 44 to aid in the ionization of gas injected between the electrodes. The generator 16 cannot generally ionize gas at low pressures, e.g., 0.1 Torr, and at small gap separations, e.g., 1–9 mm, without the further features of the invention, e.g., the pump 42, the actuators 44, and other practices according to the invention taught below. The module 10b has a total fixed capacitance that is dependent, in part, upon the module geometry, e.g., the electrode gap spacing. Thus, for example, at the high frequency of the first RF generator 16, the total fixed module capacitance has a relatively low associated impedance. This translates to a low voltage differential between the electrodes 12 and 14 for a given power. For ignition purposes, only voltage is important; hence the requirement for additional features according to the invention, such as the pump 42 and actuators 44.

Figure 4:
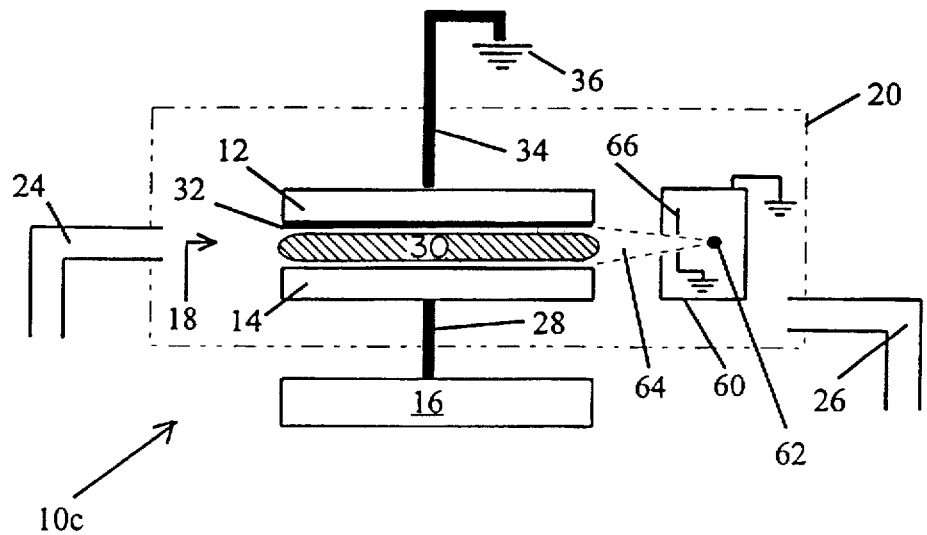
FIG. 4 is a side view of the process module of FIG. 1 with an electron source operable to enable ionization of gas within the module.

FIG. 4 shows a module 10c with the addition of an electron source 60, in accordance with the invention. The electron source 60 has a hot filament 62, operating at a low voltage and at approximately 10 amps, and emits a beam of electrons 64 through an extraction slit 66 and into the gap 18. The slit 66 is approximately ten millimeters in length and one millimeter in height, and is parallel to the gap 18. The filament 62 is at a negative potential relative to the grounded extraction slit 66 to "extract" the electrons from the filament 62 surface. Accordingly, gas injected into the gap 18 is ionized at a selective time by applying a positive voltage to the slit 66 once the filament 62 is emitting electrons.

Preferably, the electrons 64 emitted by the filament 62 have energies of approximately 300 eV when the filament is positioned at approximately 70 mm or less from the gap 18. If the filament 62 is positioned nearer to the gap 18, less energy is acceptable. However, if the filament 62 is positioned further from the gap 18, more energy is required. This phenomenon occurs because the emitted electrons 64 lose energy during travel to the gap 18, such as through collisions with other molecules in the module 10c. Additionally, different gases within the module 10c require different ionization energies. Therefore, the invention provides for differing electron illumination energies by changing the negative potential of the filament 62. This potential is adjusted by changing the voltage between the filament 62 and slit 66 to alter the energy of the emitted electrons.

Those skilled in the art will appreciate that other electron sources fall within the scope of the invention. For example, electron sources exist which are manufactured without the filament 62 of FIG. 4, and which are suitable for igniting the gas within the gap 18. The probability of ionizing gas within the gap 18 is at a maximum when electrons with energies between approximately 50 eV and 100 eV collide with the gas molecules in the gap 18. Therefore, other electron sources which are operable to generate electrons with energies between approximately 50 eV as 100 eV within the gap 18 are also suitable for ionizing gas therein in accord with the invention.

Figure 5:
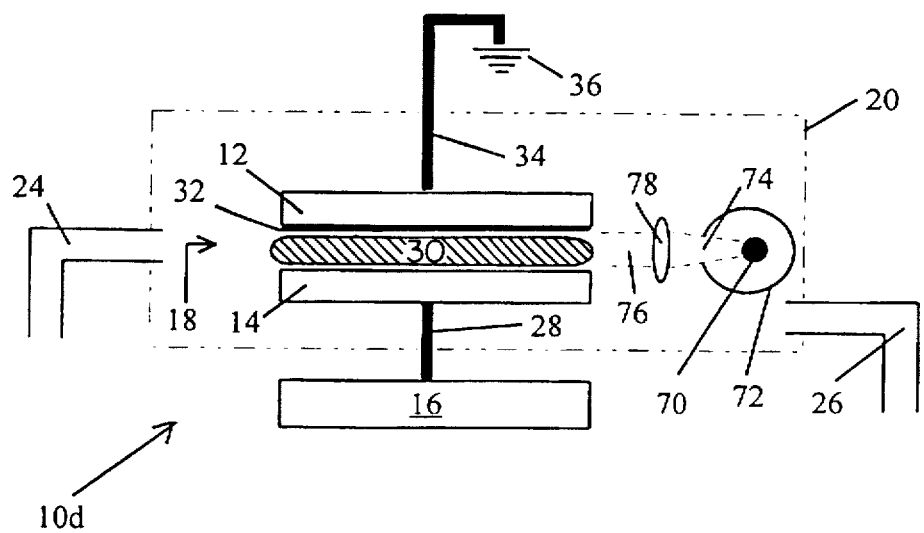
FIG. 5 is a side view of the process module of FIG. 1 with an ultraviolet source, inside the module, operable to enable ionization of gas within the gap.
Figure 5A:
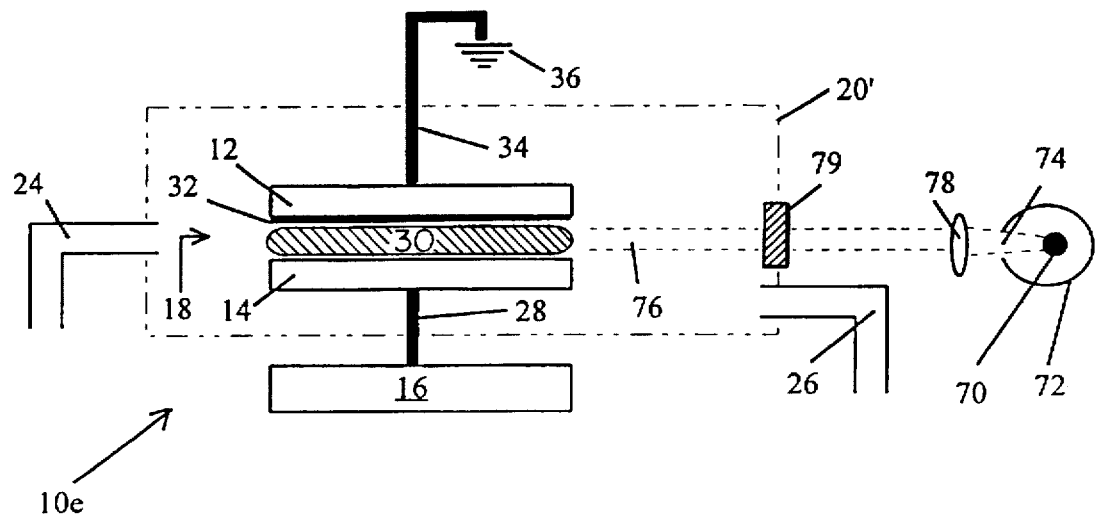
FIG. 5A is a side view of the process module of FIG. 1 with an ultraviolet source, outside the module, operable to enable ionization of gas within the gap.

FIGS. 5 and 5A illustrate one preferred practice of the invention in which an ultraviolet (UV) source 70, 72 illuminates and ignites gas within the gap 18 with UV photons:

FIG. 5 shows the UV source 70, 72 within the evacuated module 10d; while FIG. 5A shows the UV source 70, 72 outside the module 10e, in standard atmosphere.

More particularly, FIG. 5 illustrates the module 10d with a UV lamp 70 that emits UV photons. A reflector 72 surrounds the lamp 70 such that emitted photons are collected and are emitted only through the aperture 74, which directs the UV photon beam 76 generally towards the gap 18. The beam 76 is substantially collected and collimated by UV transmitting optics 78 such that the beam 76 illuminates the gap 18 without significant loss of intensity.

Similarly, FIG. 5A shows a UV source 70, reflector 72, aperture 74, beam 76, and optics 78, and additionally shows an optical interface 79 that transmits UV radiation and which preferably withstands operational pressure differentials. The interface 79 is required because the UV source 70 of FIG. 5A is positioned outside the process module 10e, e.g., exterior to the pressure-sealing housing 20'. UV energy cannot transmit through materials which typically form the housing 20', e.g., aluminum, and thus a glass-like interface 79 is required.

Preferably, the photon energies emitted by the UV source 70, 72 of FIGS. 5 and 5A are greater than approximately five electron volts.

Figure 6:
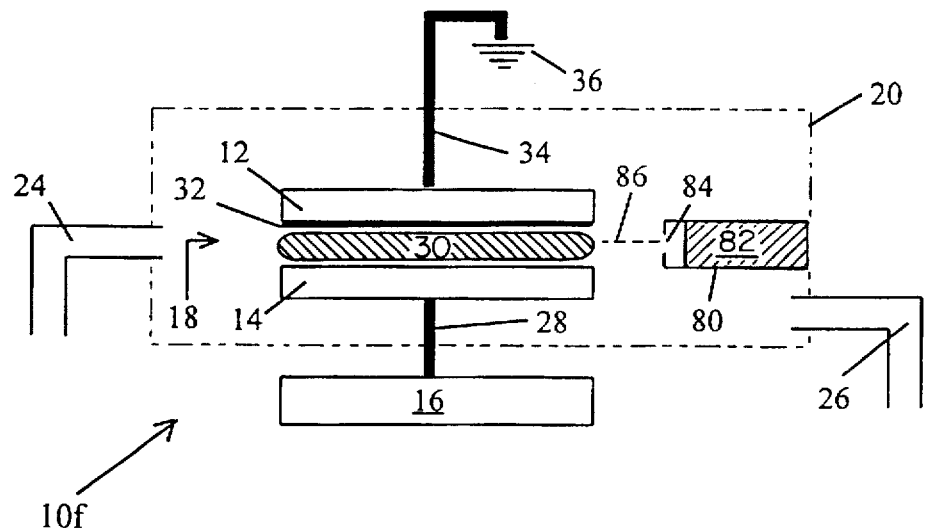
FIG. 6 is a side view of the process module of FIG. 1 with a sparking source operable to enable ionization of gas within the module.

FIGS. 6 shows another preferred practice of the invention in which a sparking source 80 generates a spark to ignite the gas within the gap 18. The sparking source has a power supply 82 connected to a spark gap 84, and is preferably electrically isolated from the electrodes 12 and 14. In operation, the power supply 82 applies a voltage across the gap 84 selectively to generate a spark. The sparking source is arranged within the module 10f such that generated sparks are introduced into the gap 18, thus ionizing gas therein. Preferably, therefore, the gap 84 has a line of sight 86 directly to the gap 18. A spark is generally induced by a voltage differential across the gap 84 in the kilovolt range and thus generates electrons with high energies. These electrons emit in all directions and many collide with the electrodes 12 and 14, which in turn release secondary electrons that ignite the gas within the gap 18. These secondary electrons include electrons with maximum ionization probabilities for a given gas, e.g., those electrons with energies between approximately 50 eV and 100 eV.

Figure 7:
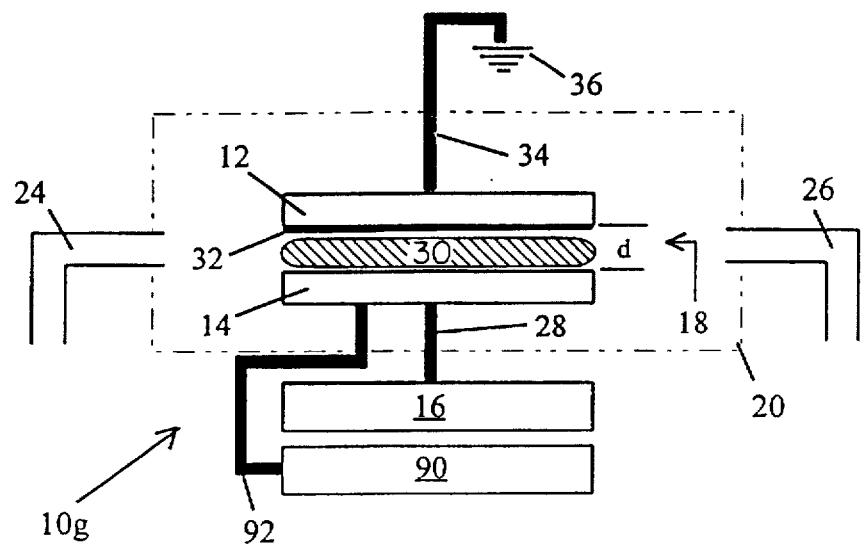
FIG. 7 is a side view of the process module of FIG. 1 with a second RF generator connected to the active electrode and operable to enable ionization of gas within the module.

FIG. 7 shows another preferred practice of the invention for igniting gas within a process module 10g. In FIG. 7, the process module 10g has a second RF generator 90 connected to the second electrode 14 via RF line 92. The second RF generator 90 has a second frequency, preferably 400 kHz, which is less than the preferred primary frequency of 60 MHz. The second RF generator 90 is selectively operable to apply RF energy at the lower frequency to the gap 18. The second RF generator 90 is energized only for a short duration, at a time sufficient to ionize gas within the gap 18. Alternatively, the generator 90 is repetitively pulsed at approximately once per second to ionize the gas.

In operation, the primary 60 MHz energy combines with the lower 400 kHz energy to ignite and ionize the gas. Each generator 16 and 90 provides approximately equal energy, e.g., 0.05 W/cm$^2$ to 1 W/cm$^2$ within the gap 18; yet, as stated earlier, the high frequency of the first RF generator 16 lacks sufficient voltage to ionize gas within a gap 18 spaced at less than approximately one centimeter. The lower frequency generator 90, on the other hand, provides relatively high voltage across the electrodes. At lower RF frequencies, such as at 400 kHz, the module capacitance has a much higher associated impedance and greater peak-to-peak voltage as compared to a 60 MHz frequency. A high voltage generates high electron energies with a corresponding increase in ionization probability. Accordingly, the generators 90 and 16 preferably combine to generate a peak-to-peak voltage between approximately one kilovolt and five kilovolts in the gap 18.

One advantage of the second RF generator 90 is that, unlike other ignition techniques described herein, no internal modifications to the module 10 are needed to ignite the gas. The generator 90 is external to the housing 20 and connects with the second electrode 14 through the RF line 92. In one practice of the invention, the line 92 is coaxial with the RF line 28, to reduce the required cabling, which pierces the evacuated housing 20 at a pressure-tight RF feed-through fitting.

In one other practice of the invention, the generator 90 is not an RF generator; but is instead a high DC power source. As stated above, voltage is an important ionization parameter. Thus, DC source 90, in this alternative embodiment, generates a spark in the gap selectively to ionize gas therein. In operation, the DC source 90 combines with the 60 MHz energy to ignite and ionize the gas. After the gas is ionized and molecules have been transformed into plasma, the DC power source 90 is turned off.

Figure 8:
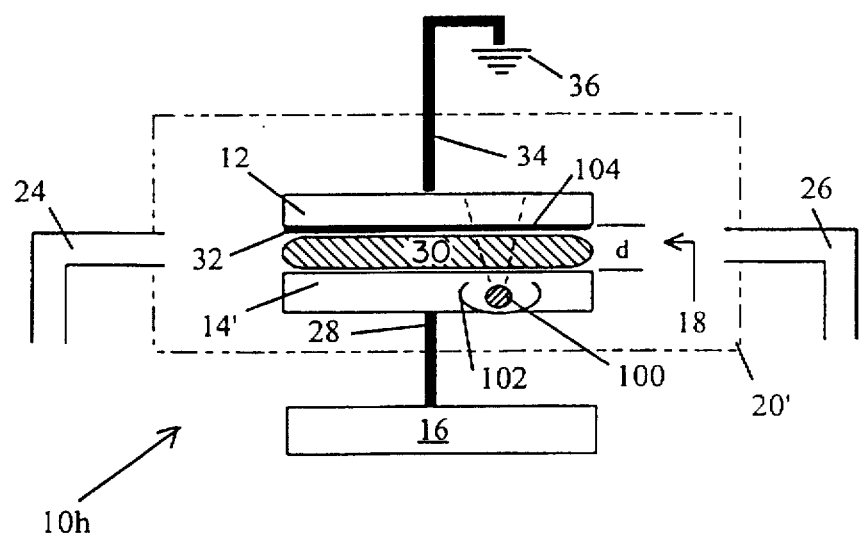
FIG. 8 is a side view of the process module of FIG. 1 with a x-ray source embedded within the active electrode and operable to enable ionization of gas within the module.

FIG. 8 shows a process module 10h constructed according to a further practice of the invention and which includes an x-ray source 100 and shielding 102. The x-ray source 100 and shielding 102 are constructed by methods known in the art to generate a beam of x-ray radiation 104 that extends through at least part of the gap 18. As illustrated, the x-ray source 100 is preferably embedded within one of the electrodes 12 and 14', here shown imbedded in electrode 14'. The shielding 102 confines the x-ray radiation to the desired beam 104, and thereby protects users of the process module 10h from the unwanted x-rays.

Alternative to an x-ray source, the source 100 can be a radioactive source in accordance with the invention. As above, a shielding 102 protects users of the module 10 and guides the emitted radioactive particles along a path that includes the gap 18.

X-ray and other radioactive radiation provide the energy required to ionize gases within the gap 18. Once ionized, the source 100 is preferably covered, via an automatic mechanical shutter (not shown), since the RF generator 16 has sufficient power to maintain plasma once the gas is ionized.

Those skilled in the art can appreciate that the source 100, x-ray or radioactive, may be positioned elsewhere to ionize gas within the gap 18. However, it is a convenient packaging to locate the source 100 within one of the electrodes 12 and 14', since both x-rays and radioactive energy propagate through the electrode material.

It is to be understood that the apparatus described in connection with FIGS. 1–8 are illustrative rather than limiting, and that additions and modifications will be apparent to those skilled in the art without departing from the scope of the claims which follow. Accordingly, variations for ionizing gas within the gap of a PECVD process module exist in accordance with the invention, other than those specifically described in connection with FIGS. 1–8.

For example, with reference to FIG. 1, the inlet 24 is used in one practice of the invention to inject combinations of gases, rather than a single gas for ionization. Alternatively, a second inlet 24 is installed into the housing wall 20 to inject additional gases. These additional gases can act as the catalyst to ignite the primary gas from which the plasma 30 is derived. More particularly, by injecting a second gas comprising helium, xenon, krypton, nitrogen, argon, neon, or other atomic elements with a primary gas, e.g., silane, electrons liberated by ionization of the molecules of the second gas cause further ionization of the primary gas molecules, e.g., silane, and enable the transformation of molecules into a plasma. Accordingly, these second gases are injected for a short duration through the inlet 24 until the gas combination ignites, whereinafter the second gas is inhibited from flowing through the module so that a deposition from a "pure", e.g., silane-based plasma results. Preferably, the injected atomic elements have ionization energies which are less than approximately 25 eV.

Additionally, those skilled in the art can appreciate that the invention as described herein is also applicable for etching surfaces within a process module, for example to "clean" the module. Etch gases such as chlorine ($Cl_2$), sulfur hexafluoride ($SF_6$), hydrogen chloride (HCl), nitrogen trifluoride ($NF_3$), carbon tetrachloride ($CCl_4$), hydrogen bromide (HBr), carbon tetrafluoride ($CF_4$), carbon dichloride difluoride ($CCl_2F_2$), boron trichloride ($BCl_3$), silicon tetrachloride ($SiCl_4$), boron tribromide ($BBr_3$), chlorotrifluoride ($ClF_3$), and fluorine ($F_2$) are typically mixed with oxygen ($O_2$) to form the preferred gaseous mixture that is ignited according to the further features of the invention. For etch purposes, the electrode spacing is generally spaced to between approximately one and seventy five millimeters.

Appended to this specification as Appendix A are detailed drawings and assembly documents that present further details of preferred constructions of process modules that (i) ignite gas and (ii) expose samples to plasma, in accordance with the invention.

In view of the foregoing, what is claimed as new and secured by the Letters Patent is:

1. In a sample-processing method for exposing a sample to reactive plasma within a process module having first and second electrodes, the improvement comprising the steps of
   (A) arranging said first and second electrodes within the module to form a substantially uniform gap separating said electrodes of between approximately one and ten millimeters,
   (B) injecting gas into said gap, said gas being selected from the group consisting of silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, and being suitable for ionization and for transformation into plasma when exposed to radiofrequency energy,
   (C) ionizing said gas, and
   (D) applying radiofrequency energy to said gap, said radiofrequency energy having a primary frequency which transforms molecules into plasma,
   wherein the step of ionizing said gas comprises the steps of generating ultraviolet radiation with an ultraviolet source and directing said ultraviolet radiation between said electrodes.

2. A method according to claim 1, the further improvement comprising the steps of providing an UV interface window that is transmissive to said ultraviolet radiation and directing said ultraviolet radiation through said UV interface window to said gap.

3. In a sample-processing method for exposing a sample to reactive plasma within a process module having first and second electrodes, the improvement comprising the steps of (A) arranging said first and second electrodes within the module to form a substantially uniform gap separating said electrodes of between approximately one and ten millimeters, (B) injecting gas into said gap, said gas being selected from the group consisting of silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, and being suitable for ionization and for transformation into plasma when exposed to radiofrequency energy, (C) ionizing said gas, and (D) applying radiofrequency energy to said gap, said radiofrequency energy having a primary frequency which transforms molecules into plasma, wherein the step of ionizing said gas comprises the step of applying a second radiofrequency energy to said gap, said second radiofrequency energy having a second frequency that is less than said primary frequency.

4. A method according to claim 3, the further improvement wherein said second frequency is approximately 400 kHz.

5. A method according to claim 3, the further improvement comprising the step of pulsing said second radiofrequency energy selectively.

6. A method according to claim 3, the further improvement comprising the step of inhibiting said second radiofrequency energy selectively after gas is ionized within said gap.

7. In a sample-processing method for exposing a sample to reactive plasma within a process module having first and second electrodes, the improvement comprising the steps of (A) arranging said first and second electrodes within the module to form a substantially uniform gap separating said electrodes of between approximately one and ten millimeters, (B) injecting gas into said gap, said gas being selected from the group consisting of silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, and being suitable for ionization and for transformation into plasma when exposed to radiofrequency energy, (C) ionizing said gas, and (D) applying radiofrequency energy to said gap, said radiofrequency energy having a primary frequency which transforms molecules into plasma, wherein the step of ionizing said gas comprises the steps of connecting a direct current source to said second electrode and generating a physical spark in said gap.

8. In a sample-processing method for exposing a sample to reactive plasma within a process module having first and second electrodes, the improvement comprising the steps of (A) arranging said first and second electrodes within the module to form a substantially uniform gap separating said electrodes of between approximately one and ten millimeters, (B) injecting gas into said gap, said gas being selected from the group consisting of silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, and being suitable for ionization and for transformation into plasma when exposed to radiofrequency energy, (C) ionizing said gas, (D) applying radiofrequency energy to said gap, said radiofrequency energy having a primary frequency which transforms molecules into plasma, wherein the step of ionizing said gas includes the step of pressurizing said module selectively such that said molecules are transformed into plasma by said first radiofrequency energy, and (E) de-pressurizing said module after said molecules are transformed into plasma by said first radiofrequency energy.

9. In a sample-processing method for exposing a sample to reactive plasma within a process module having first and second electrodes, the improvement comprising the steps of (A) arranging said first and second electrodes within the module to form a substantially uniform gap separating said electrodes of between approximately one and ten millimeters, (B) injecting gas into said gap, said gas being selected from the group consisting of silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, and being suitable for ionization and for transformation into plasma when exposed to radiofrequency energy, (C) ionizing said gas, and (D) applying radiofrequency energy to said gap, said radiofrequency energy having a primary frequency which transforms molecules into plasma, wherein the step of ionizing said gas comprises the steps of generating a beam of x-ray radiation and directing said radiation into said gap.

10. A method according to claim 9, the further improvement comprising the step of shielding said x-ray radiation such that said x-ray radiation is substantially confined to one or more paths extending through said gap.

11. In a sample-processing method for exposing a sample to reactive plasma within a process module having first and second electrodes, the improvement comprising the steps of (A) arranging said first and second electrodes within the module to form a substantially uniform gap separating said electrodes of between approximately one and ten millimeters, (B) injecting gas into said gap, said gas being selected from the group consisting of silane ($SiH_4$), disilane ($Si_2H_6$), hydrogen ($H_2$), ammonia ($NH_3$), phosphine ($PH_3$), nitrogen ($N_2$), nitrogen trifluoride ($NF_3$), helium (He), argon (Ar), carbon tetrafluoride ($CF_4$), hexafluoroethane ($C_2F_6$), oxygen ($O_2$), nitrous oxide ($N_2O$), methane ($CH_4$), borane ($BH_3$), diborane ($B_2H_6$), and mixtures thereof, and being suitable for ionization and for transformation into plasma when exposed to radiofrequency energy, (C) ionizing said gas, and (D) applying radiofrequency energy to said gap, said radiofrequency energy having a primary frequency which transforms molecules into plasma, wherein the step of ionizing said gas comprises the step of generating ionizing particles in said gap from a radioactive source.

12. A method according to claim 11, the further improvement comprising the step of shielding said radioactive source such that said ionizing particles are substantially confined to one or more paths extending through said gap.

* * * * *